US011782079B2

(12) United States Patent
Chew

(10) Patent No.: US 11,782,079 B2
(45) Date of Patent: Oct. 10, 2023

(54) SYSTEM AND METHOD FOR ANALYZING AN ELECTRONIC DEVICE

(71) Applicant: Rohde & Schwarz GmbH & Co. KG, Munich (DE)

(72) Inventor: Sam Chew, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 428 days.

(21) Appl. No.: 16/798,303

(22) Filed: Feb. 22, 2020

(65) Prior Publication Data

US 2021/0263084 A1    Aug. 26, 2021

(51) Int. Cl.
  *G01R 23/02*  (2006.01)
  *G06F 11/07*  (2006.01)
  *H04B 17/309*  (2015.01)

(52) U.S. Cl.
  CPC .............. *G01R 23/02* (2013.01); *G06F 11/07* (2013.01); *H04B 17/309* (2015.01)

(58) Field of Classification Search
  CPC ..... G01R 23/02; G01R 29/0814; G06F 11/07; H04B 17/309; H04B 1/04; H04B 2001/0408
  See application file for complete search history.

(56) References Cited

U.S. PATENT DOCUMENTS 5,414,345 A * 5/1995 Rogers ............... G01R 29/0814
                                                        324/637
2013/0307763 A1   11/2013 Jason et al.

OTHER PUBLICATIONS

Coder et al., Characterizing a Device's Susceptibility to Broadband Signals: A Case Study, 2014 IEEE International Symposium on Electromagnetic Compatibility (EMC), pp. 295-300 (Year: 2014).*
Abstractor Coder et al., 2014, 1 pp. (Year: 2014).*
Manzi et al., Coexistence Between Ultra-Wideband Radio and Narrow-Band Wireless LAN Communication Systems—Part I: Modeling and Measurement of UWB Radio Signals in Frequency and Time, May 2009, IEEE Transactions on Electromagnetic Compatibility, vol. 51, No. 2, pp. 372-381 (Year: 2009).*
Rf/microwave instrumentation, Application Note #61, 160 School House Road Souderton, PA, "Multi-tone Testing can save both time and Money", retrieved from https://www.arworld.us/pdfs/appNotes/AppNote61.pdf, dated Feb. 21, 2021, 4 pages.

* cited by examiner

*Primary Examiner* — Toan M Le
(74) *Attorney, Agent, or Firm* — DITTHAVONG, STEINER & MLOTKOWSKI

(57) ABSTRACT

The invention relates to a system for analyzing an electronic device including a signal generator configured to generate at least one composite signal within a test frequency range. The composite signal includes narrowband signals, each narrowband signal has a center frequency within a subrange of the test frequency range, a transmitter configured to transmit the composite signal to the electronic device, and an analyzing unit configured to analyze a response of the electronic device to the composite signal.

13 Claims, 5 Drawing Sheets

SYSTEM AND METHOD FOR ANALYZING AN ELECTRONIC DEVICE

TECHNICAL FIELD OF THE INVENTION

The invention relates to a system and a method for analyzing an electronic device. In particular, the invention relates to performing electromagnetic susceptibility tests on the electronic device.

BACKGROUND OF THE INVENTION

Many electronic devices undergo testing at first manufacture or later during their life cycle. Devices, which are tested in such a way, are referred to as devices under test (DUT).

Electronic devices for transmitting and/or receiving signals in the radio frequency (RF) range often undergo electromagnetic susceptibility (EMS) tests. During such tests, the functionality of the devices in different electromagnetic environments is tested. In particular, it is examined if the presence of electromagnetic radiation at certain frequencies can cause malfunctions or other unwanted behavior of the devices.

An EMS test is typically performed by placing the DUT in a shielded test chamber and transmitting an RF signal with gradually changing frequency towards the DUT. In this way, frequencies at which the DUT exhibits unwanted behavior can be detected. Often, field probes, as for instance disclosed in US 2013/0307763 A1, are placed in the test chamber next to the DUT to directly observe the RF signal during testing.

However, such EMS tests can be very time consuming, especially if the tests are performed over a large frequency range. The testing time can be reduced by increasing the frequency steps of the RF signal, thus decreasing the number of individual measurement, or by reducing a dwell time at each frequency step. However, these measures may increase the risk to overlook unwanted DUT behavior at certain frequencies, while only leading to minor time savings.

Thus, it is an objective to provide an improved system and an improved method for analyzing an electronic device, which avoid the above-mentioned disadvantages. In particular, it is an objective to provide a system and a method for performing an EMS test on an electronic device quickly and accurately.

SUMMARY OF THE INVENTION

The object of the present invention is achieved by the solution provided in the enclosed independent claims. Advantageous implementations of the present invention are further defined in the dependent claims.

According to a first aspect, the invention relates to a system for analyzing an electronic device, comprising a signal generator configured to generate at least one composite signal within a test frequency range, wherein the composite signal comprises a plurality of narrowband signals, each narrowband signal having a center frequency within a subrange of the test frequency range, a transmitter configured to transmit said composite signal to the electronic device, and an analyzing unit configured to analyze a response of the electronic device to the composite signal.

This achieves the advantage that the electronic device can be analyzed quickly over a range of frequencies.

Preferably, a failure or a malfunction of the electronic device in response to the composite signal is indicative of a susceptibility of the electronic device to a frequency within the subrange of the test frequency range.

In particular, the system carries out an electromagnetic susceptibility (EMS) test on the electronic device. The system can comprise an EMS test equipment.

The electronic device can be a device under test (DUT). The electronic device can be a measurement device, in particular for performing measurements in the radio frequency (RF) range. The electronic device can also be a communication device, e.g. a smartphone, or a sensor.

The electronic device can be integrated in a larger device or machine. In particular, the electronic device is integrated in a car.

Preferably, the composite signal and the narrowband signals are electromagnetic signals. The test frequency range can be a radio frequency (RF) range, e.g. between 150 kHz and 6 GHz.

Preferably, the composite signal covers the subrange of the test frequency range, wherein all narrowband signals of the composite signal have their respective center frequency within the subrange covered by the composite signal.

In particular, the subrange corresponds to a frequency window within the test frequency range.

Preferably, the individual narrowband signals do not overlap in frequency. For instance, the narrowband signals are 1 kHz 80% amplitude modulated (AM) signals.

Preferably, by transmitting the composite signal to the electronic device, the narrowband signals of the composite signals are transmitted together simultaneously to the electronic device.

The analyzing unit can comprise a processor. In particular, the analyzing unit is integrated in a computing device of the system, e.g. a computer or a laptop.

In an embodiment, the plurality of narrowband signals are constantly spaced within the subrange of the test frequency range.

This achieves the advantage that the composite signal uniformly covers frequencies within the subrange. Thus, the probability to overlook a critical frequency within the subrange is reduced.

In an embodiment, the system further comprises an amplifier, in particular a broadband radio frequency (RF) power amplifier, configured to amplify the composite signal before transmitting the composite signal to the electronic device. This achieves the advantage that the composite signal can be amplified to an appropriate signal strength for EMS testing.

In particular, the amplifier can be configured to amplify the narrowband signals of the composite signal to an appropriate signal level and additionally group the respective narrowband signals to form the composite signal.

In an embodiment, the system further comprises a spectrum analyzer configured to monitor the transmitted composite signal, in particular to facilitate a feedback control of the amplifier. This achieves the advantage that characteristics of the composite signal can be directly observed.

In an embodiment, the system further comprises an input for setting the test frequency range as well as a spacing and/or a total number of narrowband signals within the test frequency range. This achieves the advantage that a user can adjust the parameters of the analysis.

In an embodiment, the system comprises a control unit, wherein the control unit is configured to determine an overall number of composite signals and/or a size of the subrange of the test frequency range covered by each composite signal based on the test frequency range as well as the spacing and/or the total number of narrowband signals within the test frequency range.

The control unit can comprise a processor. In particular, the input, the analyzing unit and/or the control unit are integrated in the same computing device of the system.

In an embodiment, the analyzing unit is configured to detect a failure, a malfunction or an unexpected reaction of the electronic device in response to the composite signal. In particular, the analyzing unit is configured to detect an electromagnetic susceptibility of the electronic device in response to the composite signal.

In an embodiment, after detecting the failure, the malfunction or the unexpected reaction of the electronic device, the signal generator is configured to generate a number of test signals, wherein frequencies of the test signals lie within the subrange of the test frequency range, wherein the transmitter is configured to transmit, in particular sequentially transmit, the test signals to the electronic device, and wherein the analyzing unit is configured to analyze a response of the electronic device to each of the test signals.

This achieves the advantage that the electronic device can be analyzed accurately in a relevant frequency range. In this way, frequencies at which the electronic device fails or malfunctions can be detected efficiently and accurately.

Preferably, the test signals are narrowband signals that are transmitted towards the electronic device with a gradually increasing frequency.

In an embodiment, the signal generator is configured to generate a further composite signal, wherein the further composite signal comprises a plurality of further narrowband signals, each further narrowband signal having a center frequency within a further subrange of the frequency range, wherein the transmitter is configured to transmit said further composite signal to the electronic device, and wherein the analyzing unit is configured to analyze a response of the electronic device to the further composite signal. This achieves the advantage that the electronic device can be analyzed quickly over a further range of frequencies.

In particular, the system is configured to successively emit the composite signal and the further composite signal towards the electronic device. If the system detects a failure, malfunction or other unexpected effect of the electronic device in response to any one of the composite signal or the further composite signal, than the signal generator is configured to generate test signals within the subrange or the further subrange, respectively, wherein the transmitter configured to transmit said test signals to the electronic device, and the analyzing unit is configured to analyzes a response of the electronic device to each test signal.

In an embodiment, the subrange and the further subrange overlap partially. This achieves the advantage that overlooking critical frequencies can be avoided.

In an embodiment, the degree of overlap between the subrange and the further subrange can be set by a user, in particular by means of the input.

All the above-mentioned embodiments and/or optional features of the system for analyzing the electronic device can be combined.

According to a second aspect, the invention relates to a method for analyzing an electronic device, comprising:
  setting a test frequency range for testing the electronic device;
  generating at least one composite signal, wherein the composite signal comprises a plurality of narrowband signals, each narrowband signal having a center frequency within a subrange of the test frequency range;
  transmitting said composite signal to the electronic device; and
  analyzing a response of the electronic device to the composite signal.

This achieves the advantage that the electronic device can be analyzed quickly over a range of frequencies.

In an embodiment, the method further comprises the steps of:
  setting a spacing and/or a total number of narrowband signals within the test frequency range, and
  determining an overall number of composite signals and/or a size of the subrange of the test frequency range covered by each composite signal based on the test frequency range as well as the spacing and/or the total number of narrowband signals within the test frequency range.

In an embodiment, analyzing the response of the electronic device to the composite signal comprises detecting a failure, a malfunction or an unexpected reaction of the electronic device in response to the composite signal.

In particular, the method is a an electromagnetic susceptibility (EMS) test method, wherein analyzing the response of the electronic device to the composite signal comprises detecting an electromagnetic susceptibility of the electronic device.

In an embodiment, the method comprises the further steps of:
  after detecting the failure, the malfunction or the unexpected reaction of the electronic device, generating a number of test signals, wherein frequencies of the test signals lie within the subrange of the test frequency range;
  transmitting, in particular sequentially transmitting, the test signals to the electronic device; and
  analyzing a response of the electronic device to each test signal.

This achieves the advantage that the electronic device can be analyzed accurately in a relevant frequency range. In this way, frequencies at which the electronic device fails or malfunctions can be detected efficiently and accurately.

Preferably, the test signals are narrowband signals that are transmitted towards the electronic device with a gradually increasing frequency.

In an embodiment, the method further comprising the steps of:
  generating a further composite signal, wherein the further composite signal comprises a plurality of further narrowband signals, each further narrowband signal having a center frequency within a further subrange of the test frequency range;
  transmitting said further composite signal to the electronic device; and
  analyzing a response of the electronic device to the further composite signal.

This achieves the advantage that the electronic device can be analyzed quickly over a further range of frequencies.

In an embodiment, the subrange and the further subrange overlap, wherein the degree of overlap can be set by a user.

This achieves the advantage that overlooking critical frequencies at the boundaries of each subrange can be avoided.

All the above-mentioned embodiments and/or optional features of the method for analyzing the electronic device can be combined.

The above description with regard to the system for analyzing the electronic device according to the present invention is correspondingly valid for the method for analyzing the electronic device according to the present invention.

According to a third aspect, the invention relates to a computer program comprising a program code for performing the method of the second aspect of the invention when executed on a computer.

BRIEF DESCRIPTION OF THE DRAWINGS

The invention will be explained in the followings together with the figures.

DETAILED DESCRIPTION OF THE PREFERRED EMBODIMENTS

Figure 1:
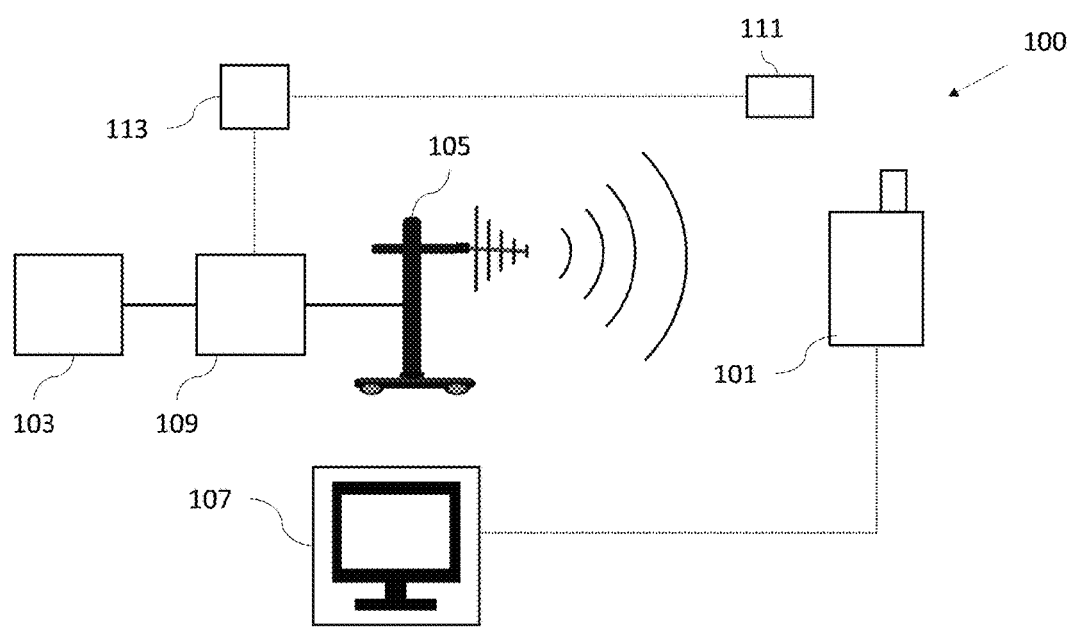
FIG. 1 shows a system for analyzing an electronic device according to an embodiment.

FIG. 1 shows a system 100 for analyzing an electronic device 101 according to an embodiment.

The system 100 comprises a signal generator 103 configured to generate at least one composite signal within a test frequency range, wherein the composite signal comprises a plurality of narrowband signals, each narrowband signal having a center frequency within a subrange of the test frequency range, a transmitter 105 configured to transmit said composite signal to the electronic device 101, and an analyzing unit 107 configured to analyze a response of the electronic device to the composite signal.

The analyzing unit 107 can be configured to detect a failure, a malfunction or an unexpected reaction of the electronic device 101 in response to the transmission of the composite signal.

The analyzing unit 107 can be configured to receive a communication signal from the electronic device 101 and analyze the response of the electronic device 101 to the composite signal, in particular detect failure/malfunction of the device 101, based on characteristics of this communication signal. For this purpose, the analyzing unit 107 can be connected to the electronic device 101 via a communication link, e.g. a wireless communication link.

Alternatively, the analyzing unit 107 can be connected to a detector of the system, wherein the detector is configured to detect electromagnetic radiation emitted from the electronic device 101. The analyzing unit 107 can be configured to analyze characteristics of the electromagnetic radiation emitted from the electronic device 101 in response to the composite signal in order to detect failures/malfunctions of the device 101.

The signal generator 103 can be a vector signal generator that is configured to generate the composite signals comprising the narrowband signals at constant frequency spacing.

The transmitter 105 can comprise a transmitting antenna.

The system 100 in FIG. 1 further comprises an amplifier 109, in particular a broadband RF power amplifier, configured to amplify the composite signal.

Preferably, the RF power amplifier 109 comprises a self protection against high VSWR (voltage standing wave ratio) from reflected broadband, pulsed or transient signals that may occur during testing.

The system 100 in FIG. 1 further comprises a spectrum analyzer 111 configured to monitor the generated composite signal. In particular the spectrum analyzer 111 is configured to measure a waveform of the composite signal and/or a channel band power. In this way, the generation of harmonics and intermodulation products can be avoided. The spectrum analyzer 111 can be arranged close to the electronic device 101.

Preferably, the system comprises a control unit 113. The control unit 113 can be configured to control and/or calibrate the amplifier 109 based on real time measurements of the spectrum analyzer 111.

In this way, the control unit 113 can prevent overloading and saturation of the amplifier 109, e.g. by controlling the amplifier 109 to reduce a signal level of the composite signal to a secure level. The control unit 113 can execute dedicated software having software algorithm for this purpose. In particular, the software can calculate an acceptable peak signal strength or RMS (root mean square) of the composite signal to prevent overload and/or saturation of the amplifier 109.

Preferably, the system comprises an input (not shown) which allows a user to set the test frequency range. The user can further set a spacing and/or a total number of narrowband signals, in particular within the entire test frequency range, by means of the input. The spacing corresponds to a frequency spacing and is, for instance, defined in Hz.

The control unit 113 can be configured to determine the number of composite signals and/or the size of the subrange covered by each composite signal based on the test frequency range as well as the spacing and/or total number of the narrowband signals. Alternatively, the user can set the size of the subrange and/or number of composite signals directly by means of the input.

The system can further comprise a memory. The analyzing unit 107 can be configured to store an analysis result in the memory. In particular, a list of frequency ranges of interest can be saved in the memory for subsequent measurements with high frequency resolution.

Preferably, the system 100 comprises a computing device, e.g. a computer or laptop, wherein the analyzing unit 107, the control unit 113, the input and/or the memory are components of said computing device.

Preferably, the system 100 comprises a shielded chamber, in particular a anechoic chamber, wherein the electronic device 101 is arranged in the shielded chamber. The transmitter 105 can be configured to transmit the composite signal into the shielded chamber.

Figure 2:
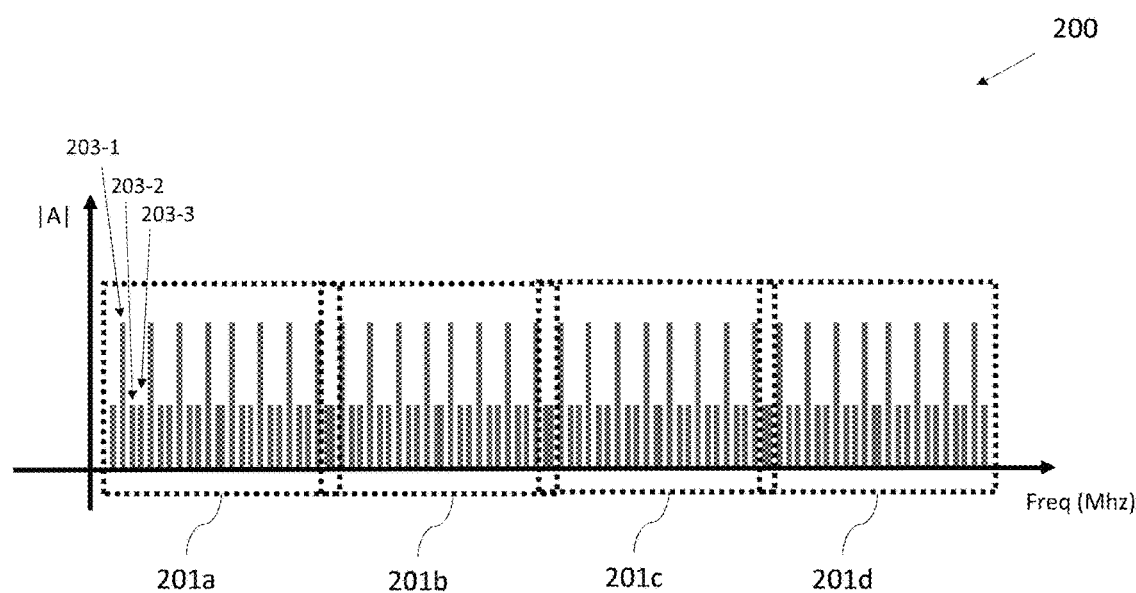
FIG. 2 shows a plot of a test frequency range according to an embodiment.

FIG. 2 shows a plot 200 of the test frequency range according to an embodiment.

The plot 200 depicts the absolute amplitude of a plurality of narrowband signals 203-1 . . . n within the test frequency range. Thereby, the test frequency range is divided into a number of subranges 201a-d, wherein each subrange 201a-d comprises a plurality of the narrowband signals 203-1 . . . n. In particular, the subranges 201a-d correspond to frequency windows within the test frequency range.

Preferably, the plurality of narrowband signals 203-1 . . . n within each subrange 201a-d are constantly spaced, in particular linearly or equidistantly distributed within the respective subrange 201a-d.

For instance, the narrowband signals 203-1 . . . n comprise 1 kHz 80% amplitude modulated (AM) signals.

In particular, each composite signal comprises the plurality of narrowband signals 203-1 . . . n within its subrange.

For instance, a composite signal comprises subrange 201a, a further composite signal comprises the further subrange 201b.

Thus, transmitting the composite signal to the electronic device 101 in the form of such a composite signal of narrowband signals 203-1 . . . n allows to quickly detect if the electronic device 101 is susceptible to failure at a frequency within the subrange 201a of the composite signal.

To cover the entire test frequency range, the signal generator can be configured to generate at least a further composite signal comprising further narrowband signals 203-1 . . . n having their center frequency in a further subrange, e.g. subrange 201b, of the test frequency range. The transmitter 105 can be configured to transmit the further composite signal to the electronic device 101, and the analyzing unit 107 can be configured to analyze the response of the electronic device 101 to the further composite signal.

In particular, a composite signal can be generated for each subrange 201a-d (frequency window) of the test frequency range. This "window scans", i.e. the analysis of the electronic device 101 by means of composite signals covering subranges of the test frequency range, achieve the advantage that a testing time of the electronic device is strongly reduced, in particular compared to a test scheme in which narrowband signals with gradually increasing frequencies are emitted in close succession until the entire test frequency range is covered.

The control unit 113 can be configured to calculate the size and number of the subranges 201a-d, and thus the number of composite signals, based on a user input.

After detecting the failure, the malfunction or the unexpected reaction of the electronic device 101 to a composite signal, the signal generator 105 can be configured to generate a number of test signals, in particular narrowband signals with gradually increasing frequency, wherein frequencies of the test signals lie within the subrange of the composite signal. The transmitter 105 can be configured to sequentially transmit the test signals to the electronic device 101, and the analyzing unit 107 can be configured to analyze a response of the electronic device 101 to each of the test signal.

In this way, the exact frequency within the subrange at which the electronic device is susceptible to electromagnetic ration can be identified. Performing this accurate frequency scan only within the subrange where the electronic device 101 showed failure/malfunction leads to an overall time saving, while the exact frequency at which the device 101 shows the failure/malfunction is identified with high accuracy.

In other words, pre-testing of the electronic device 101 can be carried out with "windows scans" using composite signals covering a subrange of the test frequency range, and a final accurate scan is only performed in subranges where the electronic device 101 showed failure/malfunction during the window scans.

As shown in FIG. 2, the subranges 201a-d of the individual composite signals can overlap partially. The degree of this overlap can be set by a user, in particular by means of the input. This overlap makes sure that also frequencies at the boundaries of a subrange are analyzed efficiently.

In particular, the subranges 201a-d can have different sizes depending on the spacing of the narrowband signals 203-a . . . n.

Figure 3:
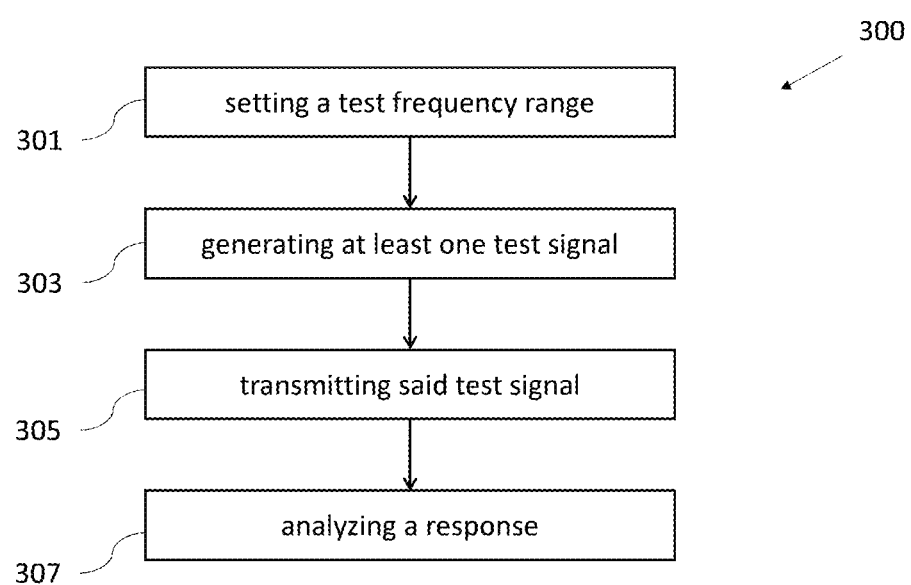
FIG. 3 shows a method for analyzing an electronic device according to an embodiment.

FIG. 3 shows a method 300 for analyzing the electronic device 101 according to an embodiment.

The method 300 comprises the steps of: setting 301 the test frequency range for testing the electronic device 101; generating 303 the at least one composite signal, wherein the composite signal comprises the plurality of narrowband signals 203-1 . . . n, each narrowband signal 203-1 . . . n having a center frequency within the subrange 201a of the test frequency range; transmitting 305 said composite signal to the electronic device 101; and analyzing 307 the response of the electronic device to the composite signal.

Preferably, the step of analyzing 307 the response of the electronic device 101 to the composite signal comprises detecting the failure, the malfunction or the unexpected reaction of the electronic device 101 in response to the composite signal.

The method 300 can comprise the further steps of: setting the spacing and/or the total number of narrowband signals 203-1 . . . n, in particular within the test frequency range; and determining the size of the subrange 201a and/or the number of composite signals, in particular based on the set test frequency range as well as the spacing and/or the total number of narrowband signals 203-1 . . . n.

Preferably, the method 300 comprises the further steps of: generating the further composite signal, wherein the further composite signal comprises the plurality of further narrowband signals 203-1 . . . n, each further narrowband signal 203-1 . . . n having a center frequency within the further subrange 201b of the test frequency range; transmitting said further composite signal to the electronic device 101; and analyzing the response of the electronic device 101 to the further composite signal.

Preferably, the subrange and the further subrange overlap partially, wherein the degree of overlap can be set by the user, e.g. by setting an overlap percentage.

Figure 4:
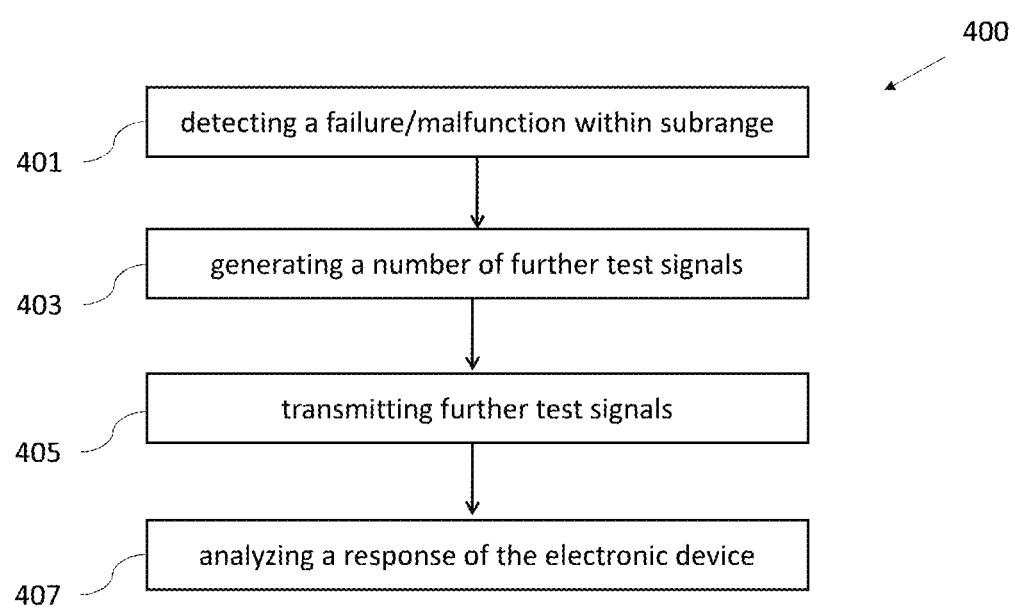
FIG. 4 shows a further method for analyzing an electronic device according to an embodiment.

FIG. 4 shows a further method 400 for analyzing the electronic device 101 according to an embodiment.

In particular, the further method 400 is performed after the method 300 if the failure, malfunction or unexpected reaction of the electronic device 101 in response to the composite signal was detected.

The further method 400 comprises the steps of: after detecting 401 the failure, the malfunction or the unexpected reaction of the electronic device, generating 403 a number of test signals, wherein frequencies of the test signals lie within the subrange of the test frequency range; sequentially transmitting 405 the test signals to the electronic device 101; and analyzing 407 the response of the electronic device 101 to each test signal.

Figure 5:
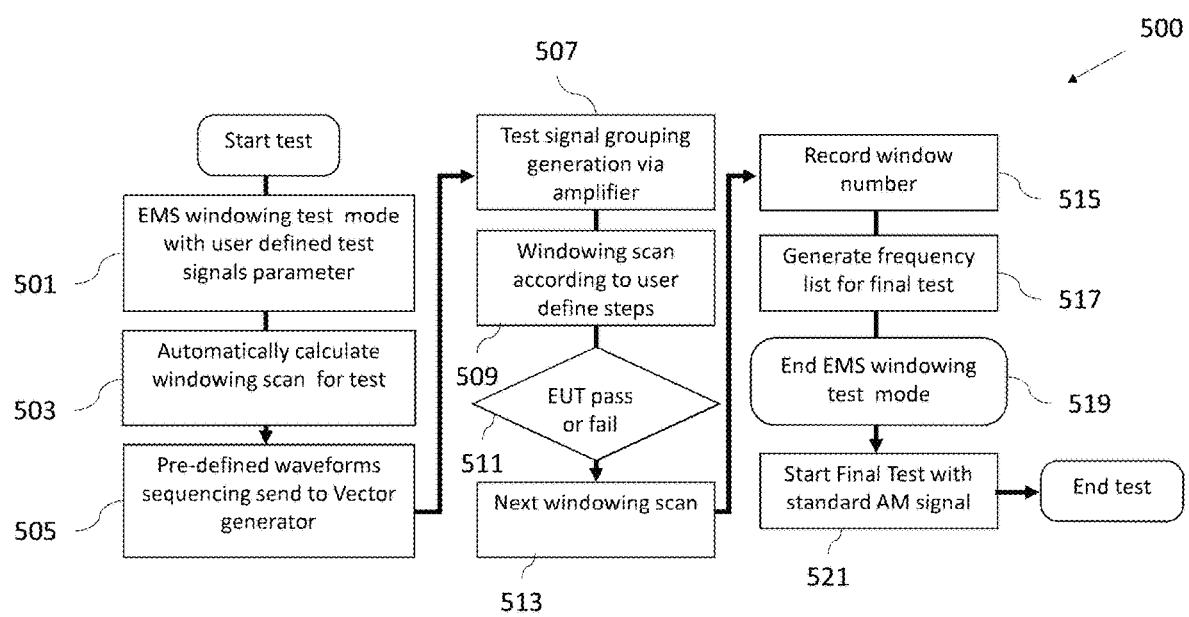
FIG. 5 shows an EMS test method according to an embodiment.

FIG. 5 shows an EMS (electromagnetic susceptibility) test method 500 according to an embodiment.

The method 500 comprises the step of initiating 501 an EMS windowing test mode with user defined signal parameters, e.g. on a system 100 as shown in FIG. 1. The parameters can comprise the overall test frequency range, the size of subranges (windows) for the composite signals and/or the number respectively distance of the narrowband signals 203-1 . . . n. The method 500 further comprises automatically calculating 503 the frequency windows, i.e. the subranges for each composite signal, forwarding 505 pre-defined waveforms sequencing, e.g. number of narrowband signals, to the vector generator, e.g. to generate the individual narrowband signals 203-1 . . . n.

The method 500 further comprises grouping 507 the narrowband signals 203-1 . . . n to generate the composite signal by means of the amplifier 109, performing a window scan 509 of the electronic device 101, i.e. transmitting the predefined and/or preset composite signal to the electronic device and analyzing the response of the electronic device 101 to the composite signal, and detecting 511 if the electronic device passes or fails, i.e. if the malfunction, the failure or the unexpected reaction of the electronic device is observed in response to the composite signal.

The method 500 further comprises performing 513 the next window scan, i.e. transmitting the further composite signal to the electronic device, recording 515 a window number, e.g. by saving the subrange of the investigated subranges and the result of the analysis in the memory, and generating 517 a frequency list of a final test. The frequency list can comprise all subranges for which the electronic device showed failure/malfunction or unexpected reactions.

The method 500 further comprises ending 519 the EMS window test mode, and starting 521 a final test with a standard amplitude modulated (AM) signal, also called immunity signal, for all frequencies in the frequency list.

The methods 300, 400 and/or 500 can be carried out by the system 100 shown in FIG. 1.

A computer program can comprise a program code for performing the methods 300, 400, 500 as shown in FIG. 3, 4 and/or FIG. 5 when executed on a computer.

All features of all embodiments described, shown and/or claimed herein can be combined with each other.

The invention claimed is:

1. A system for analyzing an electronic device, comprising:
   a signal generator configured to generate at least one composite signal within a test frequency range, wherein the composite signal comprises a plurality of narrowband signals, each narrowband signal having a center frequency within a subrange of the test frequency range, wherein the plurality of narrowband signals are constantly spaced within the subrange of the test frequency range,
   a transmitter configured to transmit said composite signal to the electronic device, and
   an analyzer configured to analyze a response of the electronic device to the composite signal,
   wherein the analyzer is configured to detect a failure, a malfunction or an unexpected reaction of the electronic device in response to the composite signal which is indicative of a susceptibility of the electronic device to a frequency within the subrange of the test frequency range,
   wherein, after detecting the failure, the malfunction or the unexpected reaction of the electronic device, the signal generator is configured to generate a number of test signals,
   wherein frequencies of the test signals lie within the subrange of the frequency range,
   wherein the transmitter is configured to transmit the test signals to the electronic device, wherein the test signals are narrowband signals that are transmitted towards the electronic device with a gradually increasing frequency, and
   wherein the analyzer is configured to analyze a response of the electronic device to each of the test signals.

2. The system according to claim 1, further comprising an amplifier, in particular a broadband RF power amplifier, configured to amplify the composite signal before transmitting the composite signal to the electronic device.

3. The system according to claim 1, further comprising a spectrum analyzer configured to monitor the transmitted composite signal, in particular to facilitate a feedback control of the amplifier.

4. The system according to claim 1, further comprising an input for setting the test frequency range as well as a spacing and/or a total number of narrowband signals within the test frequency range.

5. The system according to claim 4, wherein the system comprises a controller, wherein the controller is configured to determine an overall number of composite signals and/or a size of the subrange of the test frequency range covered by each composite signal based on the test frequency range as well as the spacing and/or the total number of narrowband signals within the test frequency range.

6. The system according to claim 1,
   wherein the signal generator is configured to generate a further composite signal, wherein the further composite signal comprises a plurality of further narrowband signals, each further narrowband signal having a center frequency within a further subrange of the frequency range,
   wherein the transmitter is configured to transmit said further composite signal to the electronic device, and
   wherein the analyzer is configured to analyze a response of the electronic device to the further composite signal.

7. The system according to claim 6, wherein the subrange and the further subrange overlap partially.

8. The system according to claim 7, wherein the degree of overlap between the subrange and the further subrange can be set by a user.

9. A method for analyzing an electronic device, comprising:
   setting a test frequency range for testing the electronic device;
   generating at least one composite signal, wherein the composite signal comprises a plurality of narrowband signals, each narrowband signal having a center frequency within a subrange of the test frequency range, wherein the plurality of narrowband signals are constantly spaced within the subrange of the test frequency range;
   transmitting said composite signal to the electronic device; and
   analyzing a response of the electronic device to the composite signal;
   wherein analyzing the response of the electronic device to the composite signal comprises detecting a failure, a malfunction or an unexpected reaction of the electronic device in response to the composite signal which is indicative of a susceptibility of the electronic device to a frequency within the subrange of the test frequency range;
   after detecting the failure, the malfunction or the unexpected reaction of the electronic device, generating a number of test signals, wherein frequencies of the test signals lie within the subrange of the frequency range;
   transmitting the test signals to the electronic device;
   wherein the test signals are narrowband signals that are transmitted towards the electronic device with a gradually increasing frequency; and
   analyzing a response of the electronic device to each test signal.

10. The method according to claim 9, wherein the method further comprises the steps of:
    setting a spacing and/or a total number of narrowband signals within the test frequency range, and
    determining an overall number of composite signals and/or a size of the subrange of the test frequency range covered by each composite signal based on the test frequency range as well as the spacing and/or the total number of narrowband signals within the test frequency range.

11. The method according to claim 9, further comprising the steps of:
- generating a further composite signal, wherein the further composite signal comprises a plurality of further narrowband signals, each further narrowband signal having a center frequency within a further subrange of the test frequency range;
- transmitting said further composite signal to the electronic device; and
- analyzing a response of the electronic device to the further composite signal.

12. The method according to claim 11, wherein the subrange and the further subrange overlap partially, wherein the degree of overlap can be set by a user.

13. A non-transitory computer-readable medium comprising instructions which, when executed by a computer, cause the computer to carry out the steps of the method of claim 9.

* * * * *